United States Patent [19]
Ruch et al.

[11] Patent Number: 5,933,322
[45] Date of Patent: Aug. 3, 1999

[54] COMPUTER DOCKING STATION WITH INTEGRAL BASE SECURITY SYSTEM

[75] Inventors: Mark H. Ruch, Woodlands; Steven S. Homer, Cypress; Kelly K. Smith, Spring; Jason Q. Paulsel, Conroe; Greangsak Jongolnee, Houston, all of Tex.

[73] Assignee: Compaq Computer Corporation, Houston, Tex.

[21] Appl. No.: 08/735,673

[22] Filed: Oct. 23, 1996

[51] Int. Cl.[6] .................................. G06F 1/16; H05K 7/10
[52] U.S. Cl. ......................... 361/686; 361/732; 361/725; 361/685
[58] Field of Search ...................... 361/686, 683, 361/785, 685, 684, 732, 725, 754, 798, 783; D14/107; 439/152–157

[56] References Cited

U.S. PATENT DOCUMENTS

| | | | |
|---|---|---|---|
| D. 371,769 | 7/1996 | Shima et al. ............................ | D14/107 |
| 4,833,554 | 5/1989 | Dalziel et al. ........................... | 361/686 |
| 5,126,890 | 6/1992 | Wade et al. .............................. | 361/686 |
| 5,211,566 | 5/1993 | Bates et al. .............................. | 439/157 |
| 5,305,180 | 4/1994 | Mitchell et al. ......................... | 361/685 |
| 5,319,519 | 6/1994 | Sheppard et al. ........................ | 361/685 |
| 5,340,340 | 8/1994 | Hastings et al. ......................... | 439/157 |
| 5,463,742 | 10/1995 | Kobayashi ............................... | 361/679 |
| 5,481,431 | 1/1996 | Siahpolo et al. ......................... | 361/685 |
| 5,483,419 | 1/1996 | Kaczeus, Sr. et al. .................. | 361/685 |
| 5,518,412 | 5/1996 | Larabell ................................... | 439/157 |
| 5,526,493 | 6/1996 | Shu .......................................... | 361/683 |
| 5,552,959 | 9/1996 | Penniman et al. ....................... | 361/686 |
| 5,612,927 | 3/1997 | Morrison et al. ........................ | 361/685 |
| 5,694,292 | 12/1997 | Paulsel et al. ........................... | 361/686 |
| 5,765,933 | 6/1998 | Paul et al. ................................ | 361/685 |
| 5,790,373 | 8/1998 | Kim et al. ................................ | 361/685 |
| 5,793,614 | 8/1998 | Tollbom .................................. | 439/157 |
| 5,825,616 | 10/1998 | Howell et al. ........................... | 361/684 |

*Primary Examiner*—Lynn D. Feild
*Assistant Examiner*—Lisa Lea-Edmonds
*Attorney, Agent, or Firm*—Konneker & Smith, P.C.

[57] ABSTRACT

A computer docking station is provided which, in a disclosed embodiment thereof, includes multiple security features. The security features are operable to prevent access to interior portions of the docking station, prevent access to a card bay of the docking station, prevent ejection of a disk drive from a disk drive module of the docking station, and prevent operation of the disk drive module. Operation of the security features may be simultaneously and conveniently initiated by rotating a keyed lock mechanism to thereby rotate a cam mounted thereto.

15 Claims, 16 Drawing Sheets

COMPUTER DOCKING STATION WITH INTEGRAL BASE SECURITY SYSTEM

CROSS-REFERENCE TO RELATED APPLICATION

This application is related to a copending application entitled "COMPUTER DOCKING STATION WITH HALF-HEIGHT BAYS AND ASSOCIATED SECURITY SYSTEM", attorney docket no. CMPQ-1211, and having Mark H. Ruch, Steven S. Homer, and Greangsak Jongolnee as inventors thereof. The copending application is incorporated herein by this reference.

BACKGROUND OF THE INVENTION

1. Field of the Invention

The present invention relates generally to personal computers and, in a disclosed preferred embodiment, more specifically provides a computer docking station with an integral base security system.

2. Description of Related Art

It is well known in the art to enhance the convenience of using a portable, notebook, or laptop computer (hereinafter, a "portable" computer) by providing a docking station to which the computer may be interconnected. In this manner, the computer is readily interconnected to a relatively large monitor, additional storage devices, such as disk drives, additional capabilities, such as those provided by PC cards, networks, speakers, input devices, additional microprocessors and memory devices, etc., when the computer is docked with the docking station in a user's office or home.

When, however, the computer is separated from the docking station, such as when the user desires to travel and at the same time have access to the computer, the docking station typically remains at the user's home or office. This situation presents security concerns, since the user is away from the home or office, but the storage devices, PC cards, and the remainder of the docking station are typically left unattended at the home or office.

Other security concerns are presented when the computer is left docked with the docking station and the user is away from the home or office. In this situation, due to the very portability of the computer, a thief or other unauthorized person may easily remove the computer from the docking station and transport it away from the user's home or office.

From the foregoing, it can be seen that it would be quite desirable to provide a computer docking station which does not permit access to the docking station and its associated components when the computer is docked with or detached from the docking station, but which permits the computer to be conveniently docked and detached from the docking station when the user so desires. It is accordingly an object of the present invention to provide such a computer docking station.

SUMMARY OF THE INVENTION

In carrying out principles of the present invention, in accordance with a preferred embodiment thereof, a computer docking station is provided which includes security features capable of preventing access to storage media, cards, and portions of the docking station, and capable of interrupting power used to operate devices within the docking station. To enhance a user's convenience, the security features are simultaneously operable in the disclosed embodiment.

In one aspect of the present invention, a computer docking station is provided which utilizes a cam to operate a switch. The switch is electrically interconnected between a power supply and a power-consuming device of the docking station.

The docking station includes a housing, a power supply operatively mounted within the housing, a cam rotatably mounted within the housing, a power-consuming device, and a switch mounted proximate the cam. The switch is activatable by rotation of the cam within the housing.

In another aspect of the present invention, a computer docking station of the type capable of operatively receiving a portable computer docked therewith and of operatively receiving a portable disk drive therein is provided. The docking station includes a disk drive module, a cam, and a bar interconnecting the disk drive module and the cam. The disk drive module is capable of operatively receiving the disk drive therein and of ejecting the disk drive therefrom. The bar may be displaced by the cam to prevent ejection of the disk drive from the disk drive module.

In yet another aspect of the present invention a computer docking station of the type having a structural enclosure defining an interior portion of the docking station and having an opening formed therethrough is provided. The docking station includes a closure, a cam, and a bar.

The closure is positionable relative to the enclosure opening to thereby block access to the interior portion. The cam is mounted within the enclosure, and the bar is displaceable by the cam between at least first and second positions. The bar is capable of preventing displacement of the closure relative to the enclosure opening when the bar is in the first position.

In still another aspect of the present invention, a computer docking station of the type having an enclosure and an opening formed thereon for operatively receiving a card thereinto is provided. The docking station includes a member, a cam, and a bar. The member is positionable relative to the enclosure in a selected one of at least two positions. In one of the positions, the member prevents removal of the card from the opening. In the other of the positions, the member permits removal of the card from the opening.

The cam is operatively mounted within the enclosure. The bar is positionable by operation of the cam in a selected one of two positions. The bar is capable of preventing displacement of the member from its position preventing removal of the card when the bar is positioned in one of its two positions.

In basic terms, the present invention provides a computer docking station which includes an enclosure, first and second openings formed on the enclosure, a disk drive module operatively mounted within the enclosure, the disk drive module being capable of operatively receiving a disk drive therein, a power supply capable of supplying power to operate the disk drive module, a switch interconnected between the power supply and the disk drive module, a closure disposable in an overlying relationship with the first opening, a first member disposed on the closure and positionable to prevent displacement of the closure from its overlying relationship with the first opening, a second member disposed proximate the second opening and positionable to block access to the second opening, a third member disposed on the disk drive module and positionable relative thereto to prevent ejection of the disk drive from the disk drive module, a fourth member disposed proximate the second member, the fourth member being engageable with the second member to prevent displacement of the second member in at least one direction relative to the second opening, a fifth member disposed proximate the first member, the fifth member being positionable relative to the first member to prevent displacement of the first member from its position preventing displacement of the closure, and a cam mounted within the enclosure, the cam being capable of displacing the third, fourth, and fifth members, and the cam further being capable of actuating the switch.

DETAILED DESCRIPTION

Figure 1:
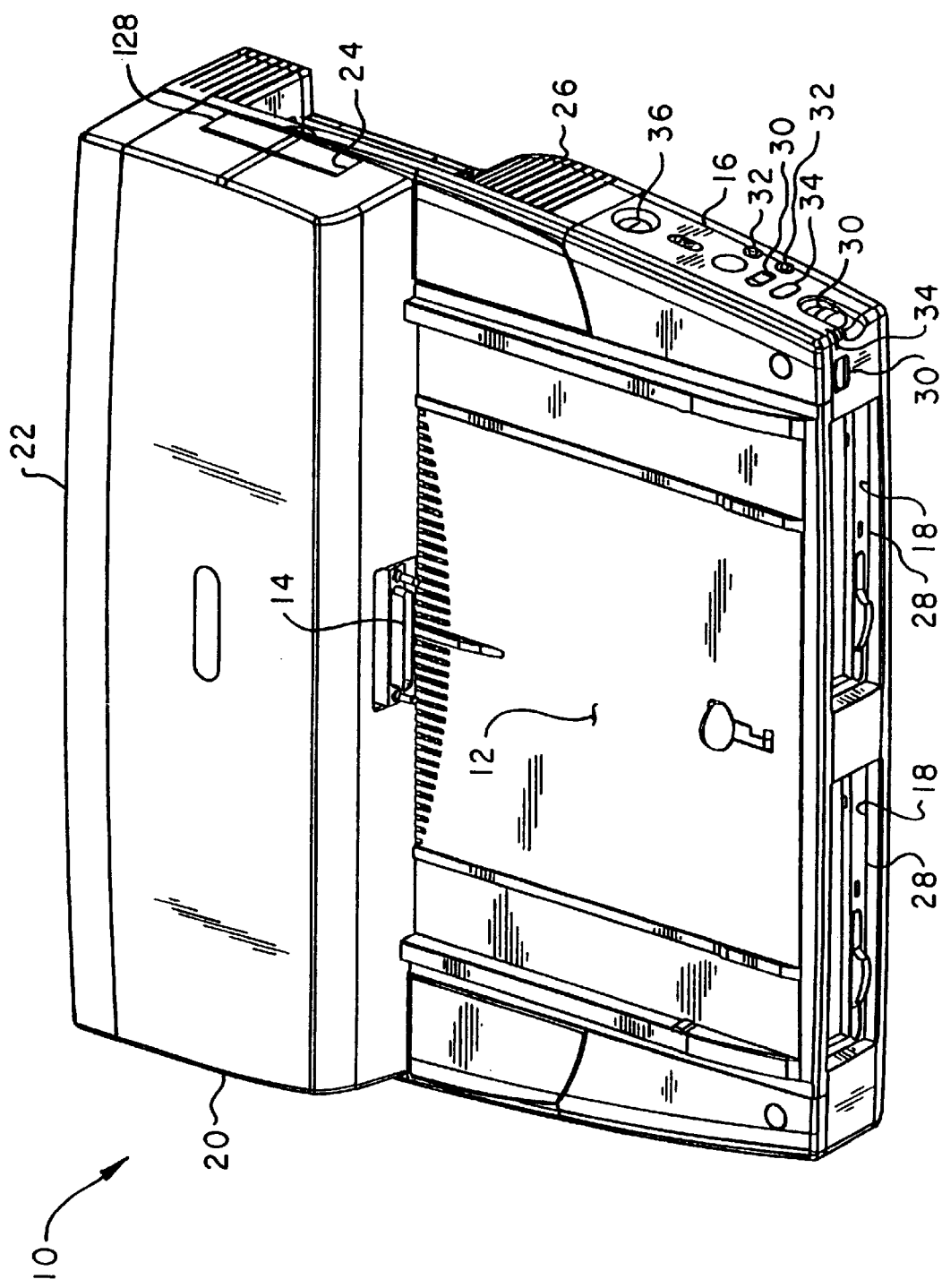
FIG. 1 is a top, right, and front perspective view of a computer docking station embodying principles of the present invention.
Figure 2:
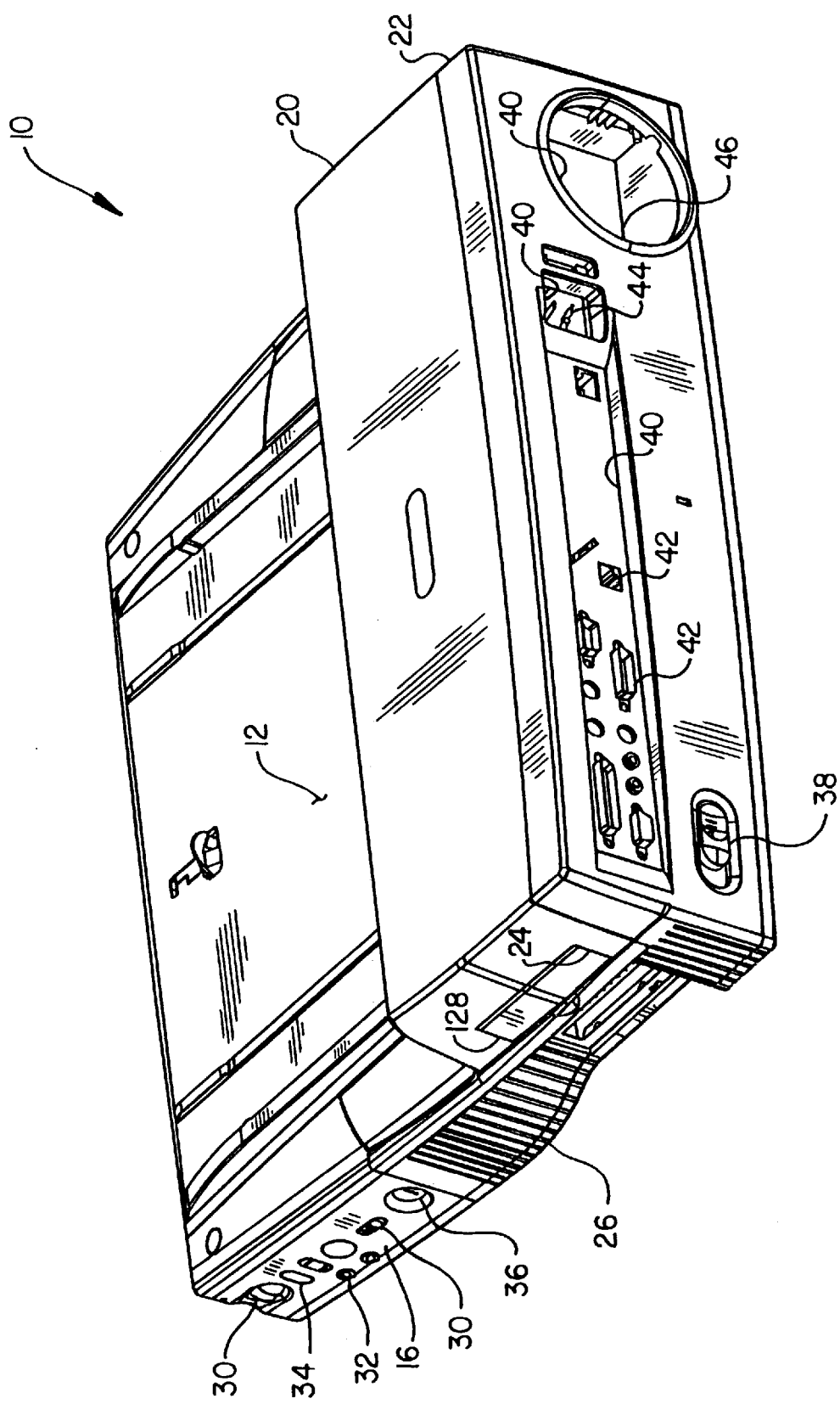
FIG. 2 is a top, right, and rear perspective view of the docking station of FIG. 1.

Representatively illustrated in FIGS. 1 & 2 is a computer docking station 10 embodying principles of the present invention. The docking station 10 is configured to receive a portable computer (not shown) on an upwardly facing and generally planar platform 12 formed thereon. A connector 14 (for communicating data and/or power between the computer and the docking station 10) is disposed rearwardly adjacent the platform 12 for convenience in connecting a mating connector on the computer (not shown) to the docking station.

The docking station 10 also includes a control module 16, two half-height disk drive bays 18, a top closure or bezel 20, a rear closure or bezel 22, a PC card bay 24, and a main housing 26. Each of the above elements of the docking station 10 are configured thereon for ease of access thereto so that the computer may be conveniently operated and connected to disk drives, PC cards, graphics adapter, power supply, etc. However, it is to be understood that these elements and others, and more or less of them, may be otherwise configured on the docking station 10 without departing from the principles of the present invention.

The disk drive bays 18 are dimensioned to correspond to conventional half-height disk drive bays, but they may be otherwise dimensioned. As shown in FIGS. 1 & 2, the disk drive bays 18 have disk drive modules 28 operatively installed therein. The disk drive modules 28 are more specifically described in the copending application entitled "COMPUTER DOCKING STATION WITH HALF-HEIGHT BAYS AND ASSOCIATED SECURITY SYSTEM" referred to hereinabove. It is to be understood, however, that other storage devices, such as conventional hard disk drives, floppy disk drives, tape drives, etc. may be utilized in the bays 18 without departing from the principles of the present invention.

The control module 16 includes switches 30, jacks 32, and indicator lights 34. The switches 30 are variously utilized to control power supply to the computer, enable or disable features of the docking station 10, etc. The indicator lights 34 indicate to a user that, for example, power is being supplied to the computer or a particular feature is being accessed.

The control module 16 also includes a keyed lock mechanism 36 which, as will be more fully described hereinbelow, may be utilized to control various security features of the docking station 10. In particular, the keyed lock mechanism 36 in the illustrated preferred embodiment is capable of, in its "off" position, preventing removal of the rear bezel 22, preventing the supply of electrical power to the various facilities of the docking station 10, preventing removal of a disk drive from either of the disk drive modules 28, and preventing removal or insertion of PC cards from or into the card bay 24. Conversely, in its "on" position, the keyed lock mechanism 36 permits removal of the rear bezel 22, permits the supply of electrical power to the various facilities of the docking station 10, for example, via the switches 30, permits a disk drive to be ejected from either of the disk drive modules 28, and permits removal and insertion of PC cards from and into the card bay 24.

Thus, the control module 16 is configured to enable control of various functions of the docking station 10, and to secure the docking station from unauthorized access to its functions and storage media. In this manner, the user may conveniently dock the computer with the docking station 10 and utilize the switches 30, jacks 32, indicator lights 30, disk drive modules 28, etc. to operate the computer. Additionally, when the user is away from the docking station 10, whether or not the computer is docked therewith, security features of the docking station may be activated by turning the keyed lock mechanism 36 to its "off" position, thereby preventing access thereto by unauthorized persons.

In FIG. 2 it may be clearly seen that the rear of the rear bezel 22 includes a latch 38 for removing the rear bezel from the docking station, and has openings 40 formed therethrough for providing convenient access to connectors 42 and a conventional power cord plug 44. One of the openings 40 is circular-shaped for enclosure of a complementarily-shaped cooling fan (not shown). The fan is utilized to provide air flow for cooling a conventional power supply 46 (e.g., a 120 VAC to 12 VDC power supply). The plug 44 is connected to the power supply 46 in a conventional manner.

As will be more fully described hereinbelow, removal of the rear bezel 22 permits removal of the top bezel 20, and thereby permits access to the interior of the docking station 10. Thus, the objective of one of the security features controlled by the keyed lock mechanism 36 is to alternately permit and prevent removal of the rear bezel 22. When the security feature is disabled, the keyed lock mechanism 36 being in its "off" position, the latch 38 may be pushed leftwardly as viewed in FIG. 2 to unlatch the rear bezel 22 from the remainder of the docking station 10. When the security feature is enabled, the keyed lock mechanism 36 being in its "on" position, the latch 38 is prevented from being pushed leftwardly, and the rear bezel may not be removed from the remainder of the docking station 10.

As will be more fully described hereinbelow, with the keyed lock mechanism 36 in its "on" position, power from the power supply 46 is permitted to be supplied to the computer, storage devices, such as the disk drive modules 28, etc. With the keyed lock mechanism 36 in its "off" position, such power is prevented from being supplied.

Figure 3:
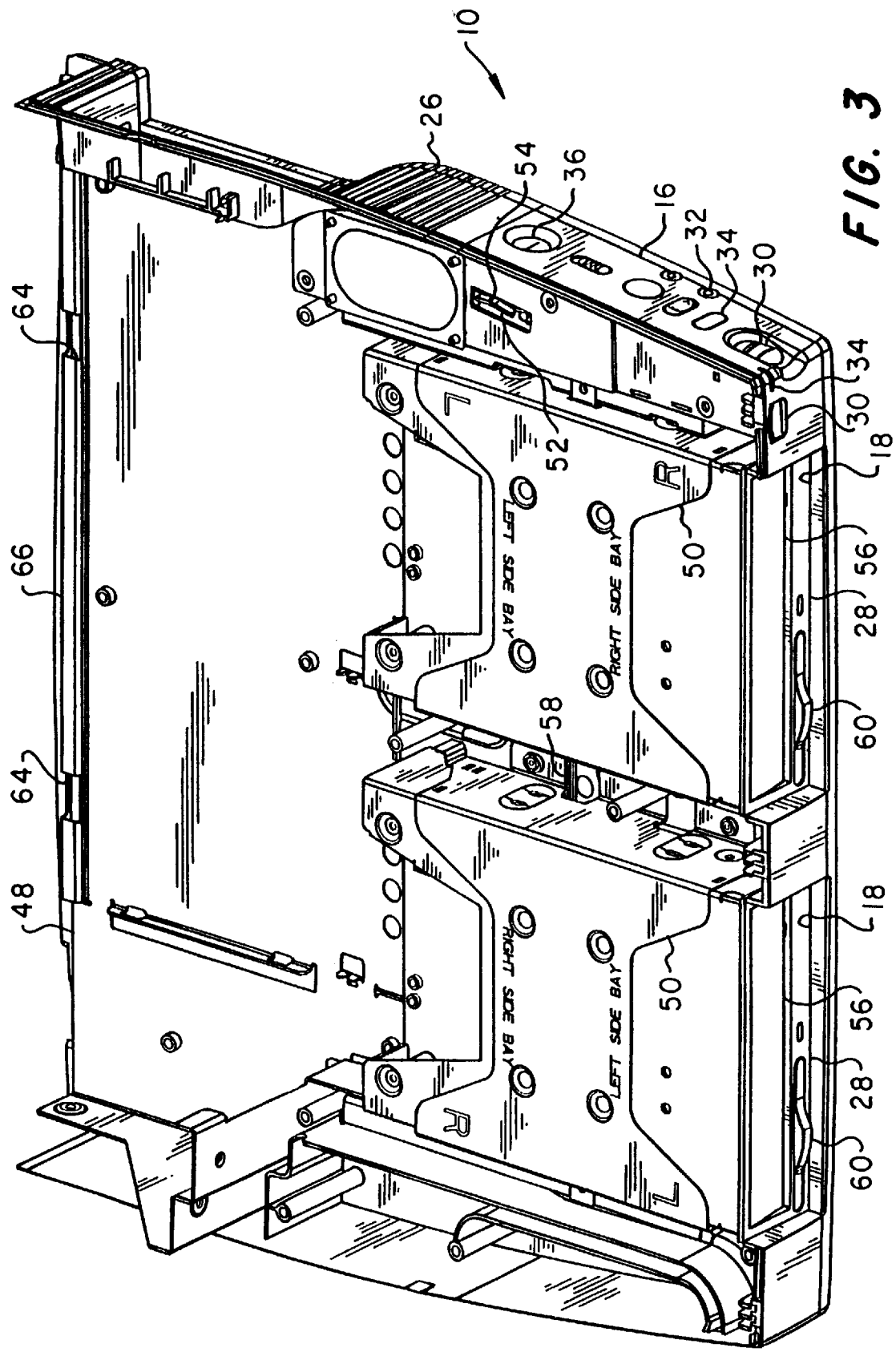
FIG. 3 is a perspective view of the docking station of FIG. 1, with top and rear portions of the docking station removed, and showing a control module and drive modules disposed therein.

Referring additionally now to FIG. 3, the docking station 10 is representatively illustrated with its top and rear bezels 20, 22, power supply 46, connectors 42, plug 44, card bay 24, and certain upper portions of its chassis 48 removed for illustrative clarity. In this view, the relationship of the disk drive modules 28 relative to the control module 16 and the remainder of the docking station 10 may be clearly seen. The disk drive modules 28 are operatively installed in the half-height bays 18 utilizing reversible cages 50 which are secured both to the disk drive modules and to the housing 26 through the chassis 48.

A cam 52 is partially visible extending upwardly through the control module 16. The cam 52 is mounted to the keyed lock mechanism 36 and is configured so that various of the security features of the docking station 10 are controllable by rotating the cam with the keyed lock mechanism 36. For example, the cam 52 has a laterally outwardly facing surface 54 formed thereon which is utilized to alternately depress and release a switch 112 (not visible in FIG. 3, see FIG. 8) within the control module 16 when the keyed lock mechanism 36 is rotated.

The cam 52 also has a laterally inwardly facing surface (not visible in FIG. 3) which is utilized to alternately enable and disable ejection of disk drives 56 installed in the disk drive modules 28. Rotation of the cam 52 by the keyed lock mechanism 36 controls lateral displacement of bars 58 (only one of which is visible in FIG. 3) relative to the control module 16 in a manner which is described in the copending application referred to hereinabove. In basic terms, displacement of the bars 58 by the cam 52 is utilized to alternately permit and prevent eject buttons 60 to be pushed leftwardly as viewed in FIG. 3 to thereby correspondingly permit and prevent ejection of the disk drives 56 from the disk drive modules 28.

The rear bezel 22 is secured to the chassis 48 by insertion and lateral displacement of tabs 62 (see FIG. 5) on the rear bezel relative to openings 64 formed through a raised laterally extending channel 66 formed on the chassis. Thus, to remove the rear bezel 22, the tabs 62 are displaced to the right as viewed in FIG. 5 by pushing the latch 38 to the left as viewed in FIG. 2, to thereby permit removal of the tabs from the openings 64. As will be more fully described hereinbelow, a radially outwardly facing surface formed on the cam 52 (not visible in FIG. 3) is utilized to control displacement of a bar (not visible in FIG. 3) which alternately permits and prevents displacement of the tabs 62 to correspondingly permit and prevent removal of the rear bezel 22 from the remainder of the docking station 10.

Figure 4:
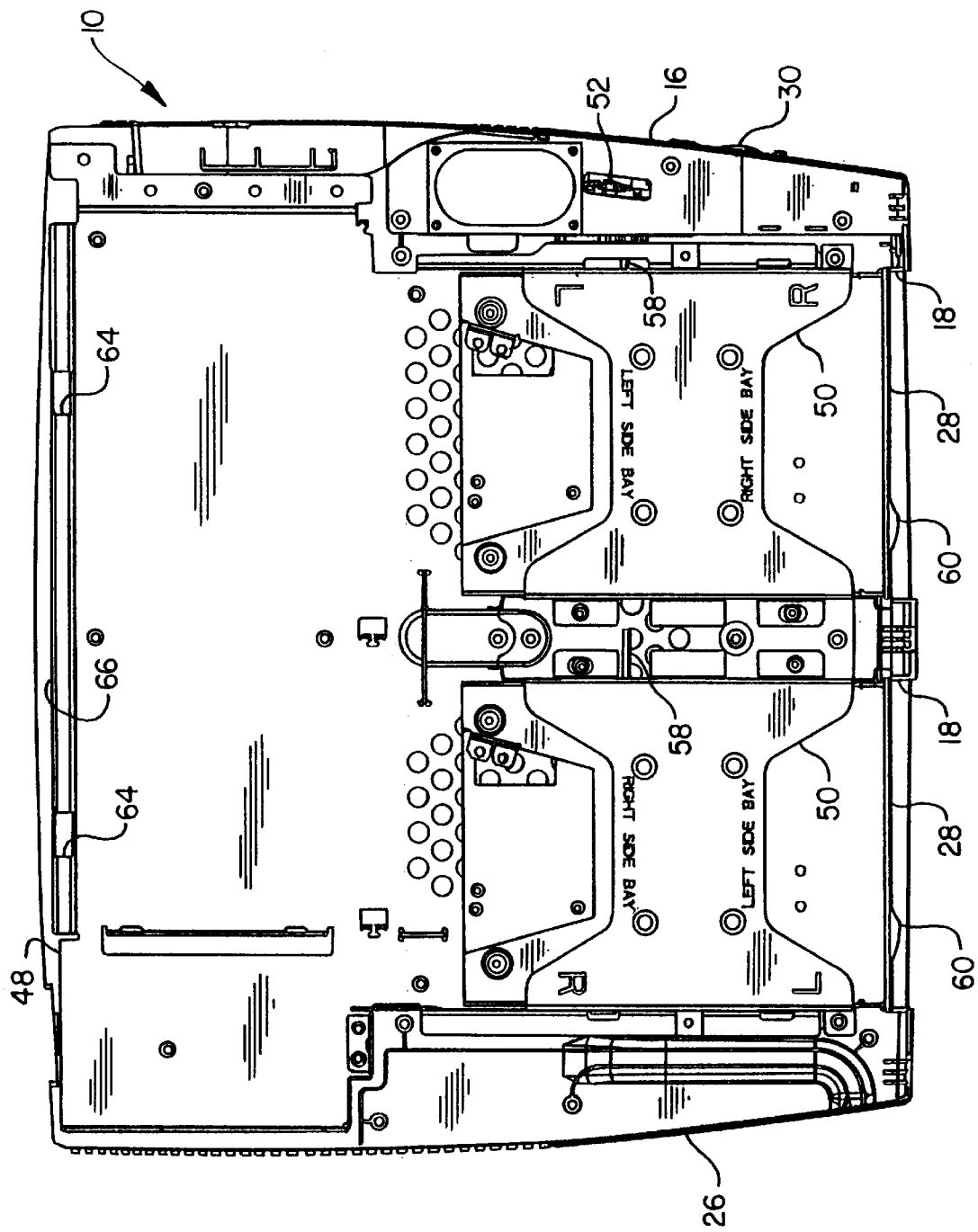
FIG. 4 is a top plan view of the docking station of FIG. 1, with top and rear portions of the docking station removed.
Figure 8:
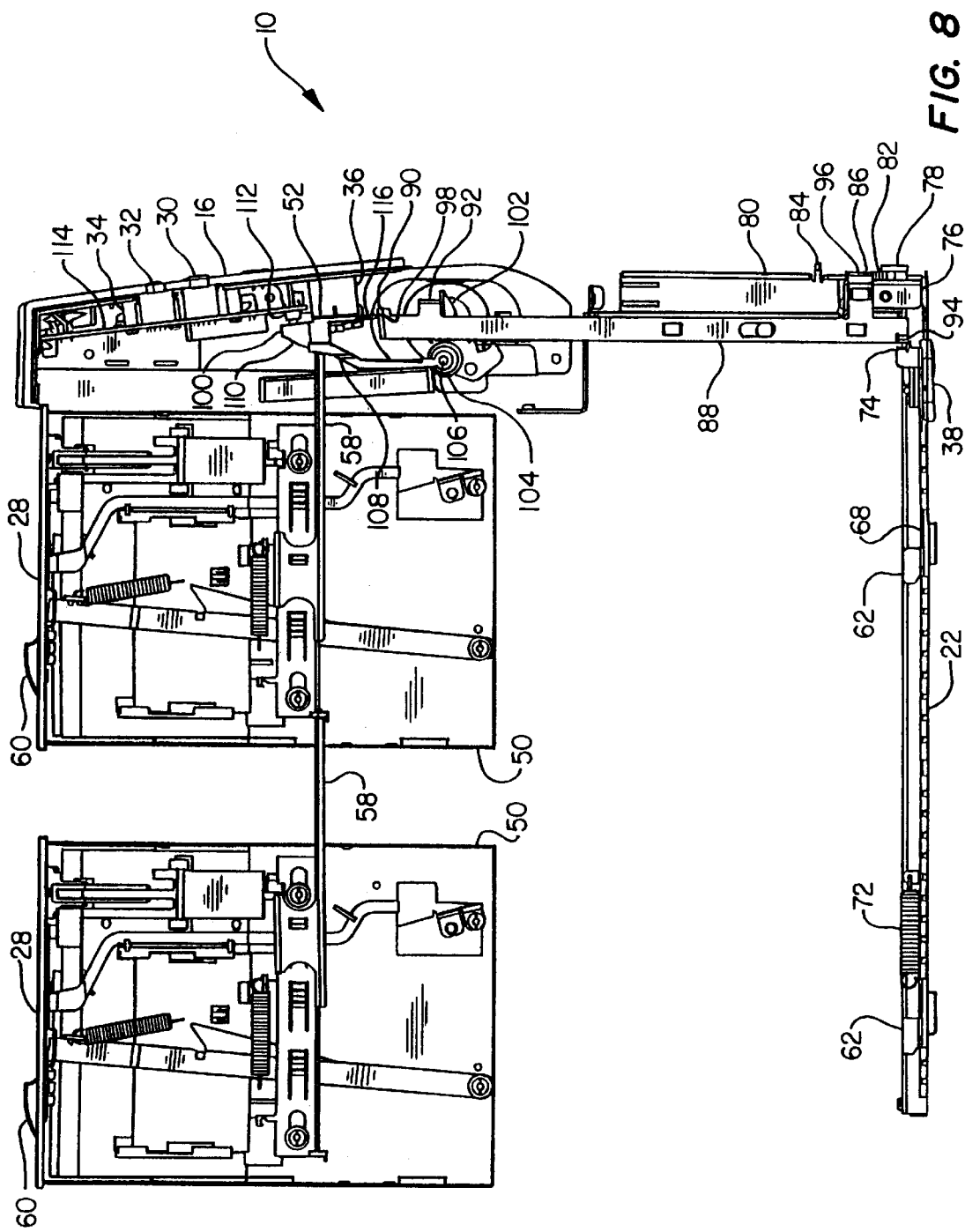
FIG. 8 is a bottom plan view of the control module and drive modules shown in FIG. 3.

Referring additionally now to FIG. 4, the docking station 10 is shown as representatively illustrated in FIG. 3, but from a top plan view thereof. Note that, as viewed in FIG. 4, the bar 58 on the rightmost disk drive module 28 extends outwardly from the disk drive module and operatively engages the cam 52. However, the bar 58 on the leftmost disk drive module 28 does not extend sufficiently far outwardly from the disk drive module to operatively engage the rightmost disk drive module. Thus, when configured as shown in FIG. 4, the disk drive ejection security feature described hereinabove may be actuated for the rightmost disk drive module 28 by appropriate rotation of the cam 52, but the same security feature may not be actuated for the leftmost disk drive module. As described in the copending application referred to above, the security feature may be actuated for the leftmost disk drive module 28 by further extending the bar 58. FIG. 8 shows a bottom plan view of the disk drive modules 28, with both bars 58 operatively engaging to permit actuation of the disk drive ejection security feature.

Figure 5:
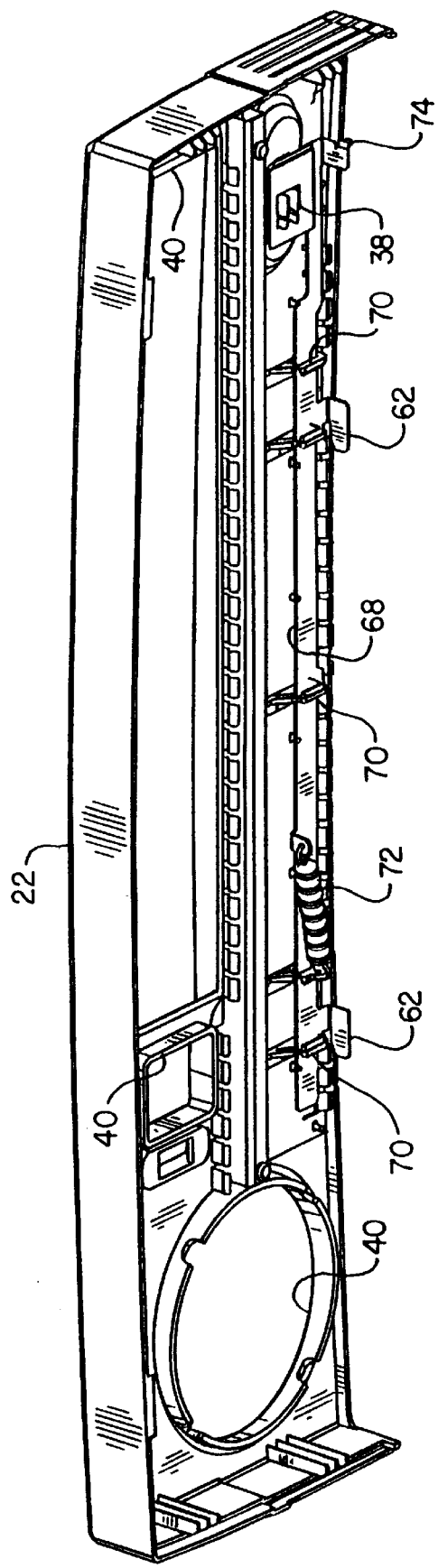
FIG. 5 is a perspective view of a rear bezel portion of the docking station of FIG. 1.

Referring additionally now to FIG. 5, the rear bezel 22 is representatively illustrated removed from the remainder of the docking station 10. In this view, the manner in which the tabs 62 are configured for being selectively received in the openings 64 on the chassis 48 may be clearly seen.

The tabs 62 are formed on a generally laterally extending bar 68, which is laterally slidingly retained by retainers 70 formed on the rear bezel 22. A spirally wound extension spring 72 is connected between one of the retainers 70 and the bar 68. The spring 72 biases the bar 68 leftwardly as viewed in FIG. 5. Thus, when operatively installed on the remainder of the docking station 10, the tabs 62 are biased into engagement with the openings 64. To release the tabs 62 from engagement with the openings 64, the latch 38 is pushed to the right as viewed in FIG. 5, to thereby overcome the biasing force exerted by the spring 72 and laterally displace the bar 68 to the right.

As will be readily appreciated by one of ordinary skill in the art, the latch 38, instead of being biased leftwardly by the spring 72, may alternatively be releasably maintained in its rightward or leftward position with respect to the rear bezel 22 by detents or projections formed on one, some, or all of the bar 68, rear bezel 22, latch 38, etc. Applicants prefer that conventional energy welds (not shown) be formed on the rear bezel 22 for engagement with the latch 38 for this purpose, and that the spring 72 not be provided. It is to be understood, however, that other methods may be provided for controlling engagement and release of the tabs 62 with the openings 64 without departing from the principles of the present invention.

A downwardly extending projection 74 is formed on the bar 68. As will be more fully described hereinbelow, when it is desired to actuate the security feature that prevents removal of the rear bezel 22 from the remainder of the docking station 10, the bar 68 is prevented from displacing rightwardly relative to the rear bezel as viewed in FIG. 5 by blocking rightward displacement of the projection 74. Thus, when it is desired to permit removal of the rear bezel 22 from the remainder of the docking station 10, the projection 74 is not blocked, and when it is desired to prevent removal of the rear bezel, the projection is blocked.

Figure 6:
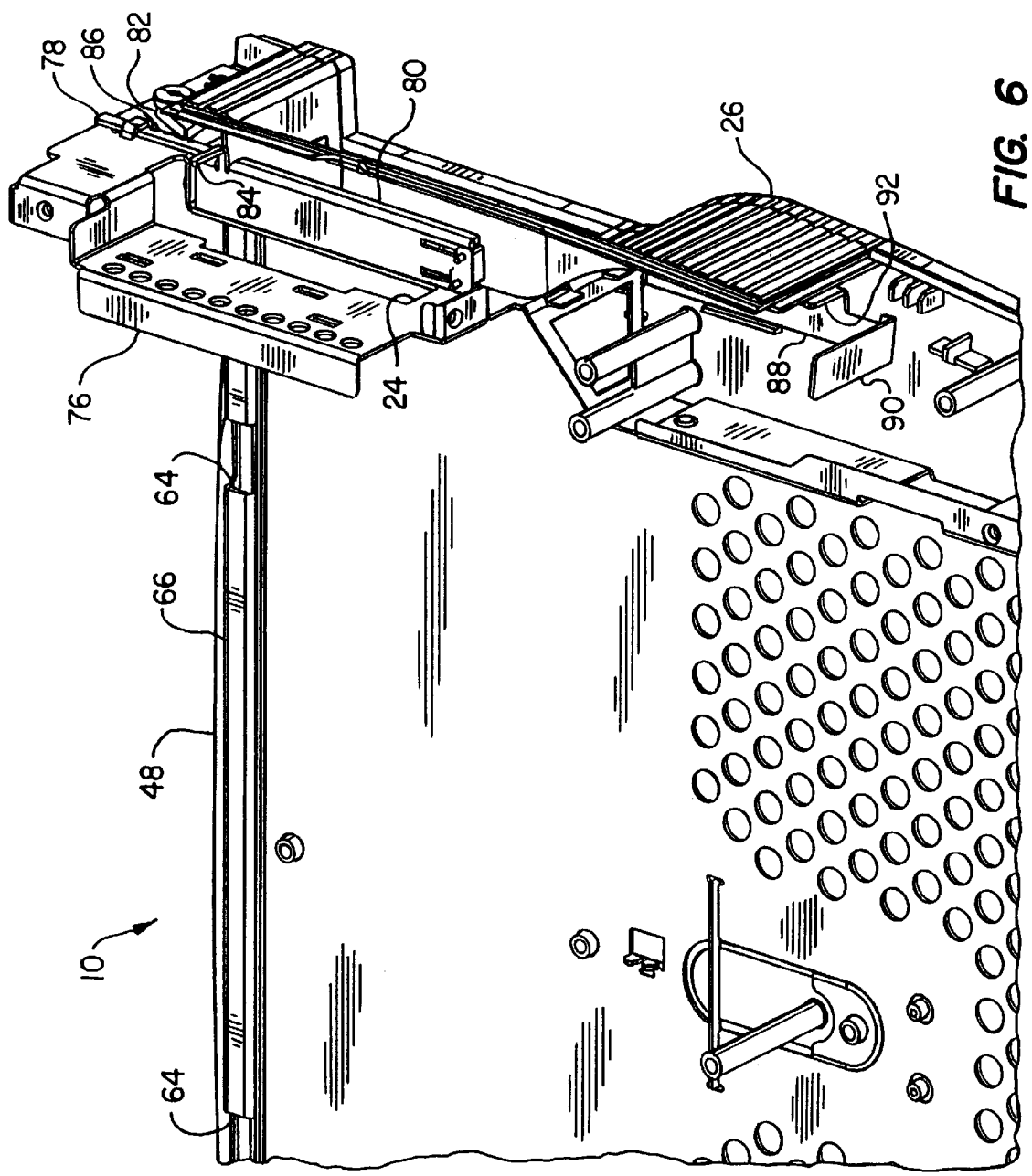
FIG. 6 is a top front perspective view of a right rear portion of the docking station of FIG. 1, with the rear bezel removed therefrom.

Referring additionally now to FIG. 6, a right rear portion of the docking station 10 is representatively illustrated with the control module 16, and the top and rear bezels 20, 22 removed therefrom. A generally vertically upstanding portion 76 of the chassis 48 is shown operatively installed within the docking station 10. The chassis portion 76 forms a part of the PC card bay 24.

Mounted to the chassis portion 76 is a mechanism 78 which may be activated to prevent access to the card bay 24. The mechanism 78 includes a forwardly and rearwardly slidable bar 80 mounted to the chassis portion 76, and a pawl 82 rotatably mounted to the chassis portion. The bar 80 has an upwardly extending projection 84 formed thereon which may be positioned to block access to the card bay 24. The bar 80 also includes a rearwardly extending ratchet portion 86 formed thereon and disposed for operative engagement with the pawl 82.

As will be described more fully hereinbelow, when the keyed lock mechanism 36 is rotated to block lateral displacement of the projection 74 and thereby prevent removal of the rear bezel 22 (see FIG. 5), a rearwardly extending bar 88 is displaced forwardly. When the bar 88 is displaced forwardly, removal of the rear bezel 22 is prevented, and the card bay 24 security feature is enabled, permitting the user to displace the projection 84 forwardly until it is disposed laterally opposite the card bay 24, thereby preventing insertion or removal of PC cards into or from the card bay. As viewed in FIG. 6, the projection 84 does not prevent access to the card bay 24.

Note that the bar 88 has two generally upwardly extending portions 90, 92. The portion 90 contacts a peripheral surface of the cam 52 and is utilized in displacing the bar 88 rearwardly when the cam is rotated by the keyed lock mechanism 36. The portion 92 is utilized in biasing the bar 88 into contact with the cam 52. The manner in which the bar 88 is made to displace with respect to the remainder of the docking station 10 will be more fully described hereinbelow in the detailed description accompanying FIG. 8.

Figure 7:
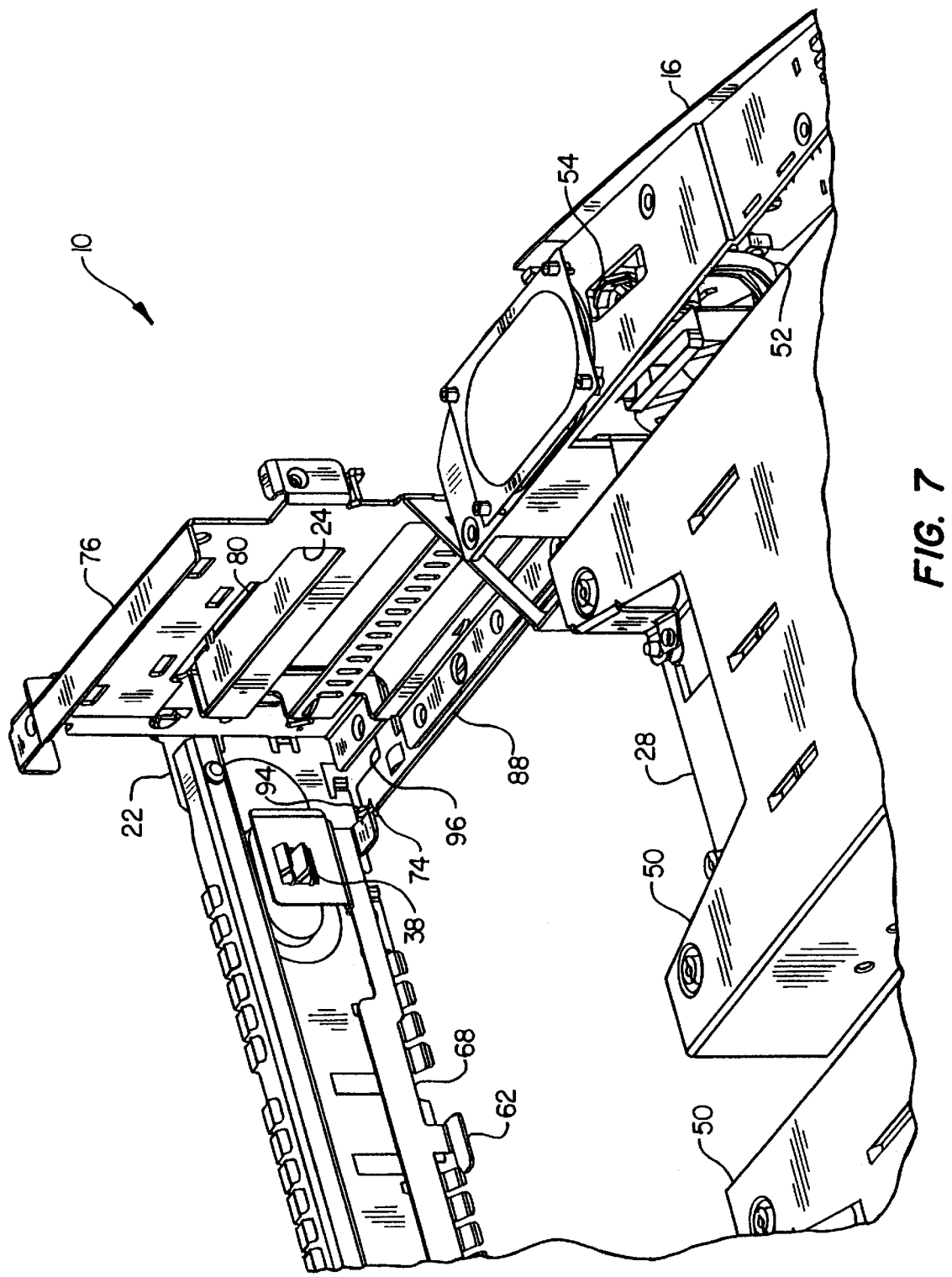
FIG. 7 is another top front perspective view of a right rear portion of the docking station of FIG. 1, with a housing and top portion removed therefrom.

Referring additionally now to FIG. 7, a right rear portion of the docking station 10 is representatively illustrated with the housing 26 and top bezel 20 removed therefrom. In this view, the relationship of the bar 88 to the bar 68 on the rear bezel 22 may be clearly seen. The bar 88 has an upwardly extending projection 94 formed thereon which is disposed to block rightward displacement of the bar 68 as viewed in FIG. 7.

The bar 88 is, thus, in its forward position with respect to the remainder of the docking station 10, the keyed lock mechanism 36 having been rotated so that the cam 52 has permitted displacement of the bar 88 forwardly. When the keyed lock mechanism 36 is subsequently rotated so that the bar 88 is rearwardly displaced with respect to the remainder of the docking station 10, the projection 94 will correspondingly be rearwardly displaced relative to the projection 74, thereby permitting lateral displacement of the bar 68 to the right as viewed in FIG. 7.

The bar 88 includes a portion 96 thereof which extends laterally outward from the remainder of the bar 88. The portion 96 is utilized to permit actuation of the card bay 24 security feature. When the bar 88 is positioned in its forward position as shown in FIG. 7, the portion 96 is engaged with the pawl 82 so that the pawl is engageable with the ratchet portion 86 of the bar 80.

Referring additionally now to FIG. 8, a bottom plan view of the docking station 10 is representatively illustrated, with the housing 26 and top bezel 20 removed therefrom. In FIG. 8, it may be clearly seen that the bar portion 96 extends laterally outward past the chassis portion 76 and adjacent the pawl 82. It may also be clearly seen that the projection 94 on the bar 88 is disposed laterally opposite and blocking displacement of the projection 74 on the bar 68.

The bar 88 is displaced relative to the remainder of the docking station 10 by means of contact between the portion 90 and a radially outwardly extending peripheral surface 98 formed on the cam 52. As shown in FIG. 8, the bar 88 is in its forward position, the surface 98 being relatively radially reduced. When the keyed lock mechanism 36 is rotated, however, so that a radially enlarged portion 100 of the cam 52 contacts the portion 90, the bar 88 is rearwardly displaced relative to the remainder of the docking station 10, thereby displacing the projection 94 so that it is no longer laterally opposite the projection 74, and permitting disengagement of the pawl 82 so that it is no longer engaged with the ratchet portion 86.

The bar 88 is biased into contact with the cam surface 98 by a lever 102 rotatably mounted to the control module 16. A spring 104 encircles a post 106 onto which the lever 102 is mounted. The spring 104 biases the lever 102 to push the bar 88 forwardly, so that the portion 90 is maintained in contact with the surface 98.

The disk drive ejection security features of the disk drive modules 28 are shown in FIG. 8 as being disengaged, even though the bars 58 are operatively positioned thereon, the rightmost bar 58 contacting a lever 108 which is pivotably mounted to the control module 16 on the post 106. The lever 108 is biased by the spring 104 to contact an inwardly facing surface 110 formed on the cam 52. Thus, the lever 108 is utilized to laterally displace the bars 58 when the cam 52 is rotated by the keyed lock mechanism 36. In normal operation, with the cam 52 rotated so that the bar 88 is in its forward position, the surface 110 of the cam has displaced the lever 108 so that both bars 58 are laterally displaced to prevent ejection of any disk drives 56 installed therein. However, the bar 58 of the rightmost disk drive module 28 as viewed in FIG. 8 is shown somewhat shortened, lateral displacement of the lever 108 failing to produce a corresponding lateral displacement of the bar 58, demonstrating another manner of preventing actuation of the disk drive ejection security feature.

A switch 112 may be seen disposed laterally outward from the cam 52 and operatively mounted to a printed circuit board (PCB) 114 installed within the control module 16. The switch 112 is disposed laterally opposite an outwardly facing surface 116 formed on the cam 52. Referring specifically to FIG. 7, it may be clearly seen that the switch depressing surface 54 is formed on the surface 116 of the cam 52. As viewed in FIG. 8, the switch 112 is open, preventing power from the power supply 46 (to which the PCB 114 is connected) from being conducted to storage devices, such as the disk drive modules 28, and to the computer via the connector 14. When, however, the cam 52 is rotated so that the surface 54 is opposite the switch 112, the surface 54 depresses the switch 112, thereby closing the switch and permitting full operation of the docking station 10.

Figure 9:
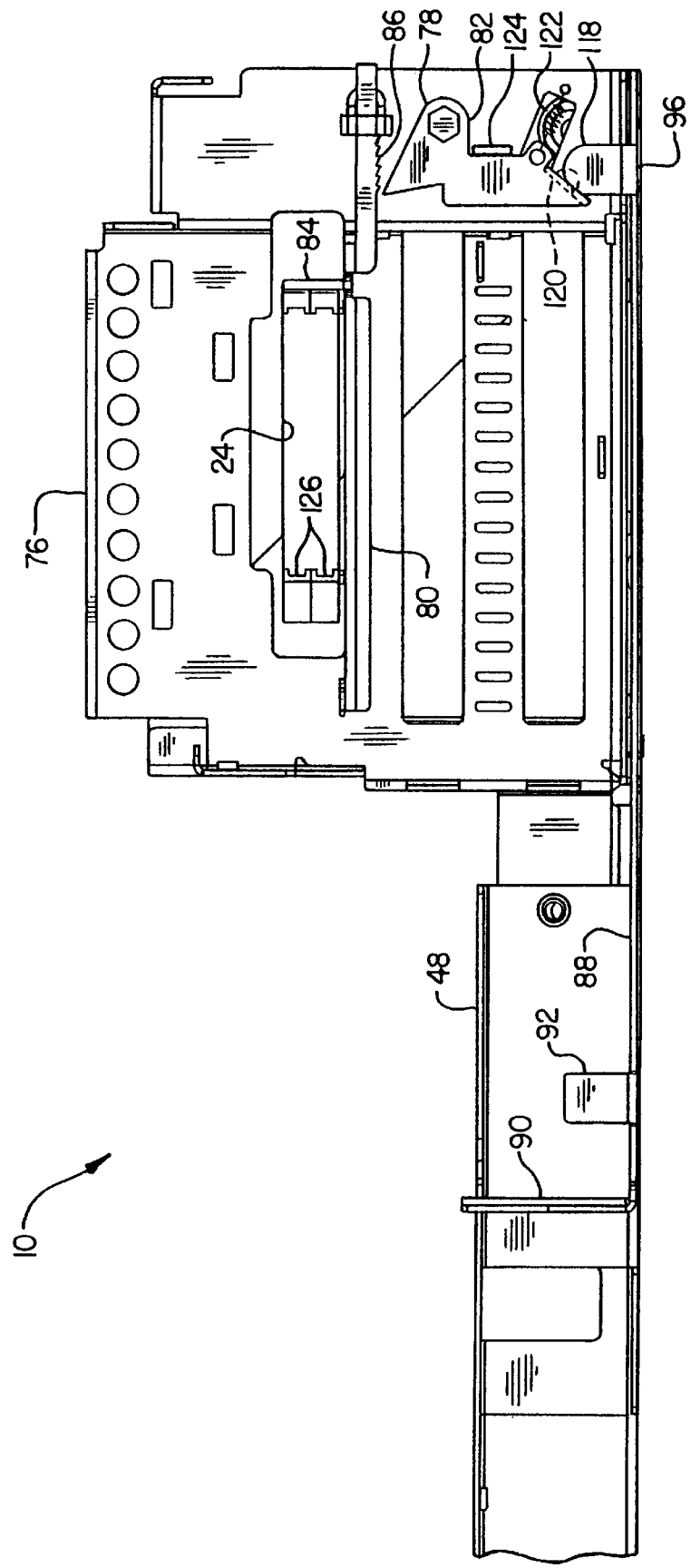
FIG. 9 is a right side elevational view of a portion of the docking station of FIG. 1, with the control module and housing removed, and with a first security feature of the docking station disabled.

Referring additionally now to FIG. 9, a right rear portion of the docking station 10 is representatively illustrated with the housing 26, top and rear bezels 20, 22, and control module 16 removed therefrom. In this view, the manner in which the portion 96 of the bar 88 engages the pawl 82 of the mechanism 78 may be clearly seen.

The pawl 82 is rotatably mounted to the chassis portion 76 below the ratchet portion 86 of the bar 80. A generally upwardly extending tab 118 formed on the portion 96 is disposed adjacent the pawl 82. Although it appears from FIG. 9 that the tab 118 is extending into the pawl 82, in fact the tab 118 is rearwardly adjacent an inner recess 120 formed on the pawl.

A spirally wound extension spring 122 is connected between the pawl 82 and the chassis portion 76. The spring 122 biases the pawl 82 counterclockwise as viewed in FIG. 9 so that the pawl rests against a stop 124 formed on the chassis portion 76. Such counterclockwise biasing of the pawl 82 also maintains the pawl out of engagement with the ratchet portion 86 of the bar 80.

With the bar 88 rearwardly disposed as viewed in FIG. 9, the card bay security feature is correspondingly disabled, permitting access to cards (not shown) installed in card slots 126 within the card bay 24. Note that the projection 84 may be conveniently pushed rearwardly or forwardly to alternately block or permit access to the card bay 24. Such displacement of the projection 84 is accomplished by the user opening a door 128 (see FIGS. 1 & 2) and manually pushing the projection 84 in the desired direction.

Figure 10:
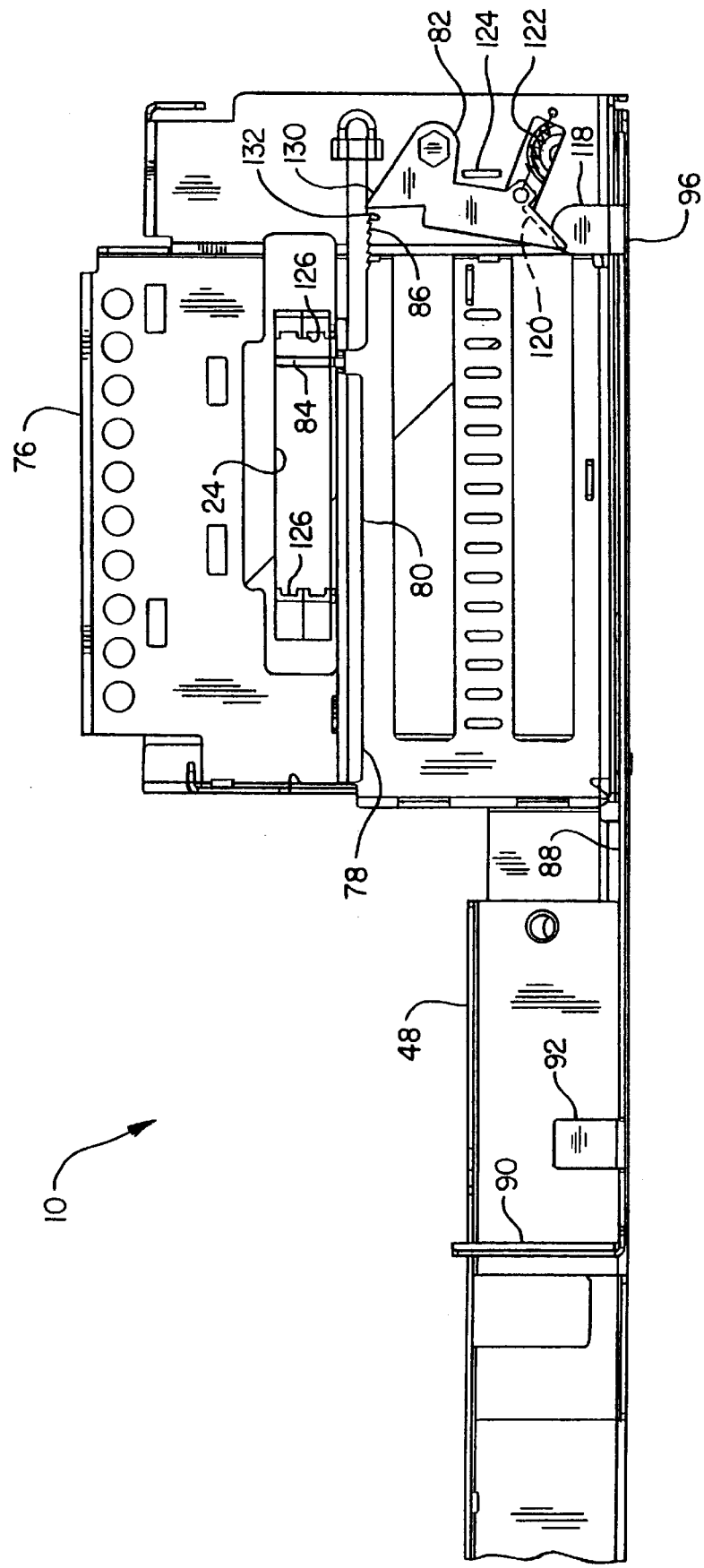
FIG. 10 is a right side elevational view of a portion of the docking station of FIG. 1, with the control module and the housing removed, and with the first security feature enabled.

Referring additionally now to FIG. 10, a right rear portion of the docking station 10 is representatively illustrated similar to FIG. 9, except that the bar 88 has been forwardly displaced relative to the remainder of the docking station. The tab 118 now contacts the pawl 82, and the pawl is maintained in contact therewith by the spring 122. An upper wedge-shaped portion 130 of the pawl 82 may be clearly seen engaging the ratchet portion 86 of the bar 80, thereby preventing rearward displacement of the bar relative to the card bay 24.

The bar 80 has been forwardly displaced relative to the card bay 24 so that the projection 84 blocks access to the card bay 24. Specifically, the projection 84 prevents insertion of a card into the card slots 126 and prevents removal of any operatively installed card from the card slots. Note that it is not necessary for the bar 80 to be completely forwardly displaced relative to the card bay 24 in order for card insertion or removal to be prevented thereby, since the projection 84 may be positioned laterally opposite the card slots 126 even though it is only partially forwardly displaced, the portion 130 of the pawl 82 operatively engaging the ratchet portion 86 nevertheless. Note also, that teeth 132 formed on the ratchet portion 86 are inclined forwardly to permit forward displacement of the bar 80 when the pawl 82 is engaged with the bar 80, but that the teeth 132 do not permit rearward displacement of the bar 80 when the pawl 82 is engaged with the bar 80 as shown in FIG. 10.

Figure 11:
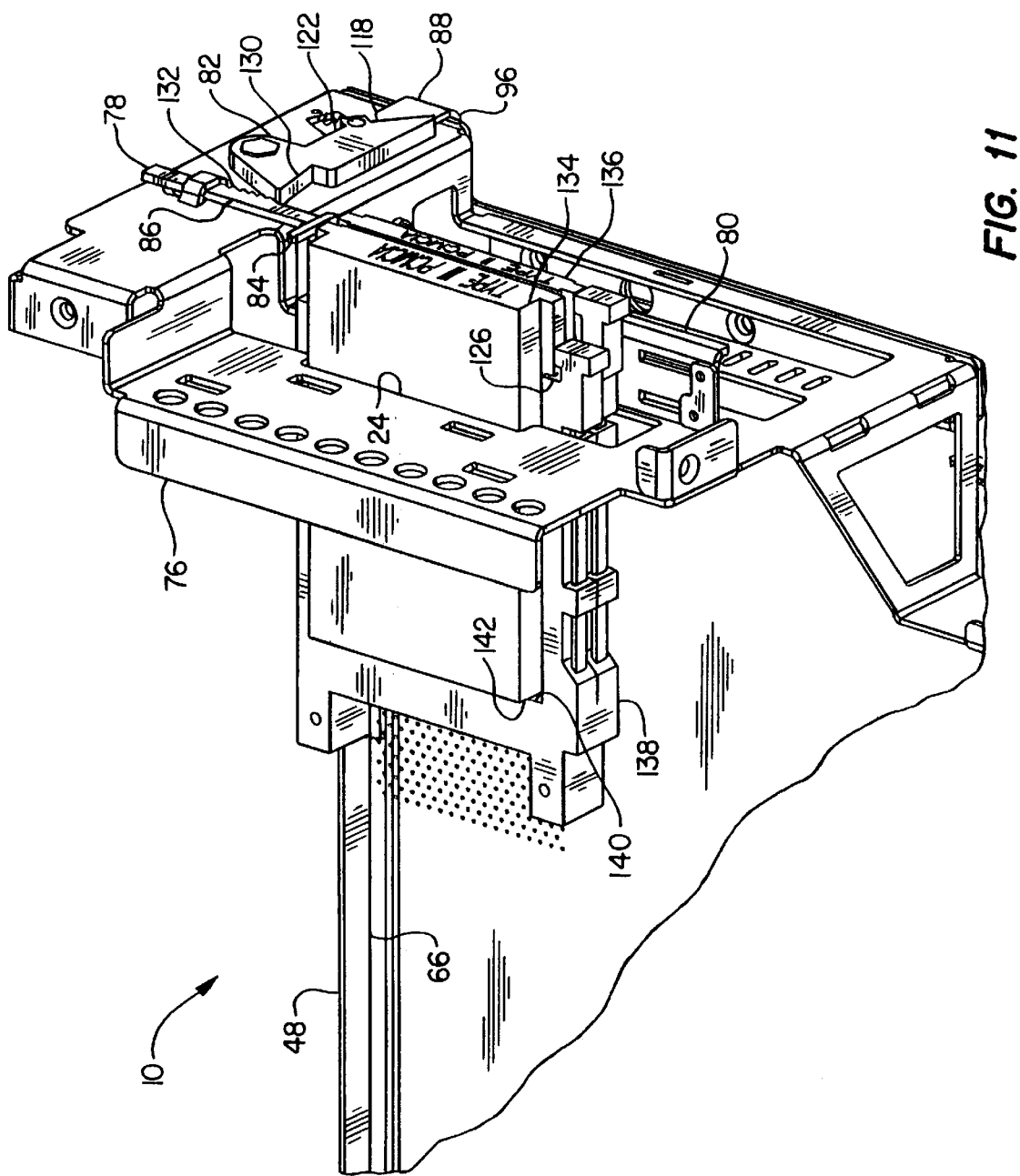
FIG. 11 is a perspective view of the right rear portion of the docking station of FIG. 1, showing the relationship between PC cards installed in a PC card bay and the first security feature.

Referring additionally now to FIG. 11, a right rear portion of the docking station 10 is representatively illustrated with the housing 26, and top and rear bezels 20, 22 removed. In FIG. 11, two PC cards, a Type III PC card 134 and a Type II PC card 136, are shown installed in the card bay 24, slidingly received in the card slots 126. The cards 134, 136 have been ejected partially from the card bay 24 by a card eject mechanism 138.

Note that, with the cards 134, 136 partially ejected as shown, the projection 84 is blocked by the cards and cannot be pushed forwardly. If, however, the cards 134, 136 are inserted further into the card bay 24 so that shoulders 140, 142 contact (i.e., the cards are operatively installed in the card bay), it may be easily seen that the projection 84 will be permitted to pass forwardly to the outside of the cards. Thus, the card bay security mechanism 78 is effective to prevent removal of the cards 134, 136 from the card bay 24 when the cards are operatively installed in the card bay. Additionally, the security mechanism 78 is effective to prevent insertion of cards 134, 136 into the card bay 24 when the projection 84 is forwardly disposed to block the card bay.

Figure 12:
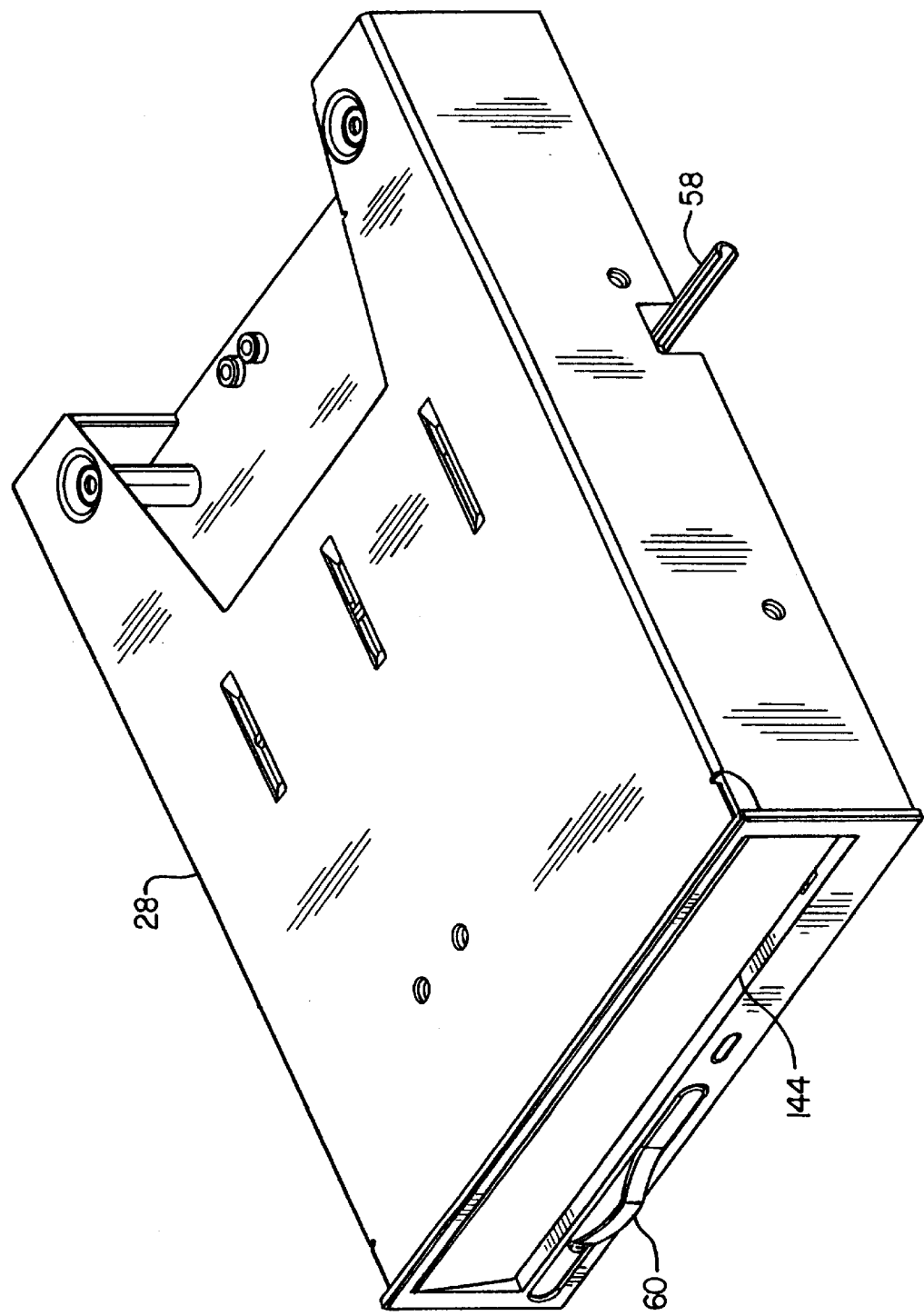
FIG. 12 is a top perspective view of a disk drive module embodying principles of the present invention, the disk drive module being operatively positionable within the docking station of FIG. 1.
Figure 13:
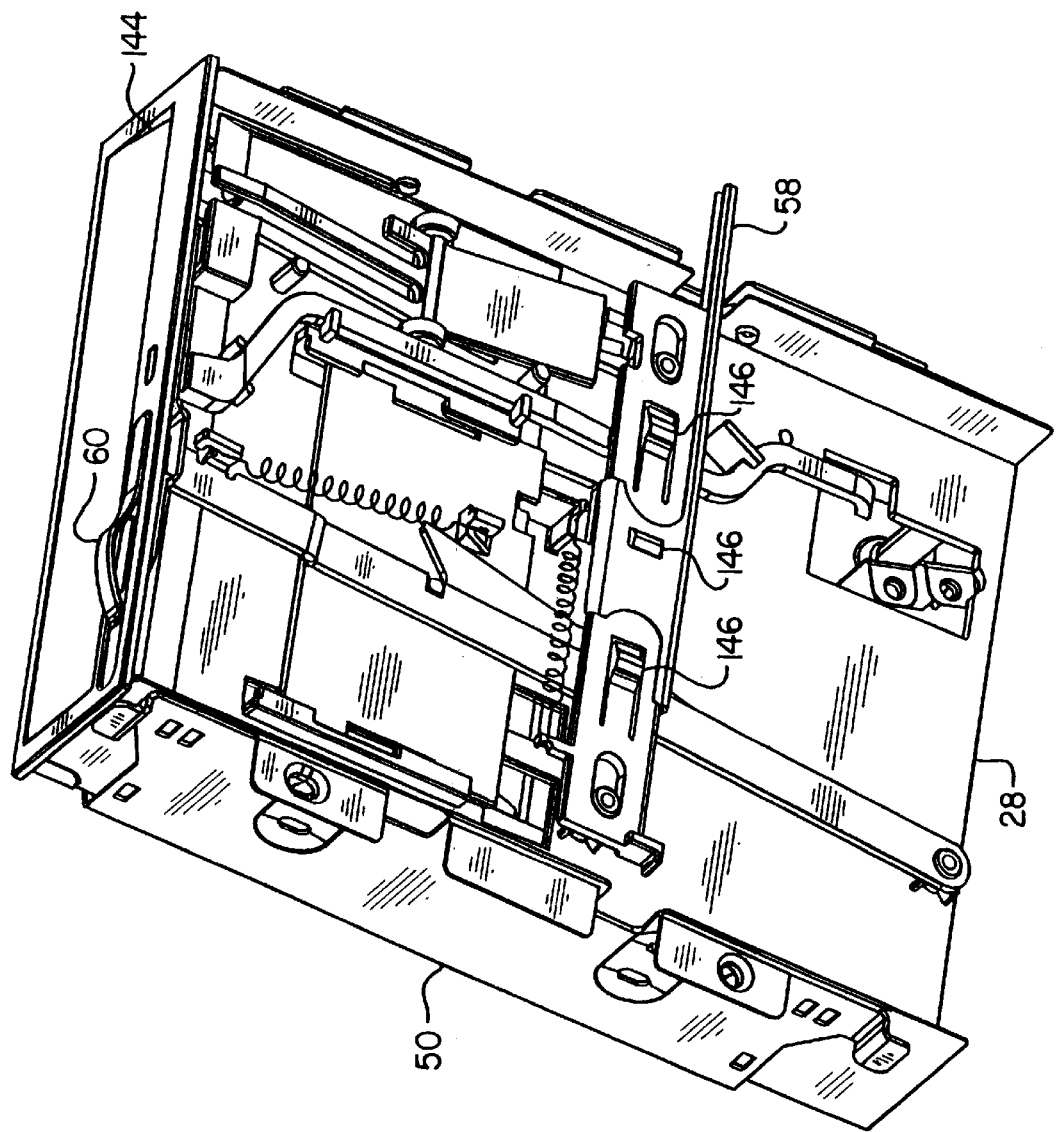
FIG. 13 is a bottom perspective view of the disk drive module of FIG. 12, showing a disk drive operatively installed therein.

Referring additionally now to FIGS. 12–16, the disk drive modules 28 are shown in various configurations with another disk drive 144 operatively installed therein. In FIG. 12, the disk drive module 28 is shown separated from its cage 50. In this configuration, the disk drive module 28 may be operatively installed in a conventional half-height disk drive bay. Of course, the disk drive module 28 may be easily modified to conform to dimensional requirements of other disk drive bays, as well. The bar 58 is shown extended somewhat laterally outward from the disk drive module 28 in an appropriate position for the bar 58 to contact the lever 108 if installed as the rightmost disk drive module in the docking station 10 as shown in FIG. 8. In FIG. 13, a bottom perspective view of the disk drive module 28 shown in FIG. 12 may be seen. The bar 58 is maintained in its position by one of three resilient fingers 146. The disk drive ejection security feature may, however, be disabled by engaging the bar 58 with the leftmost finger 146 as viewed in FIG. 13, and as more fully described in the copending application referred to hereinabove.

Figure 14:
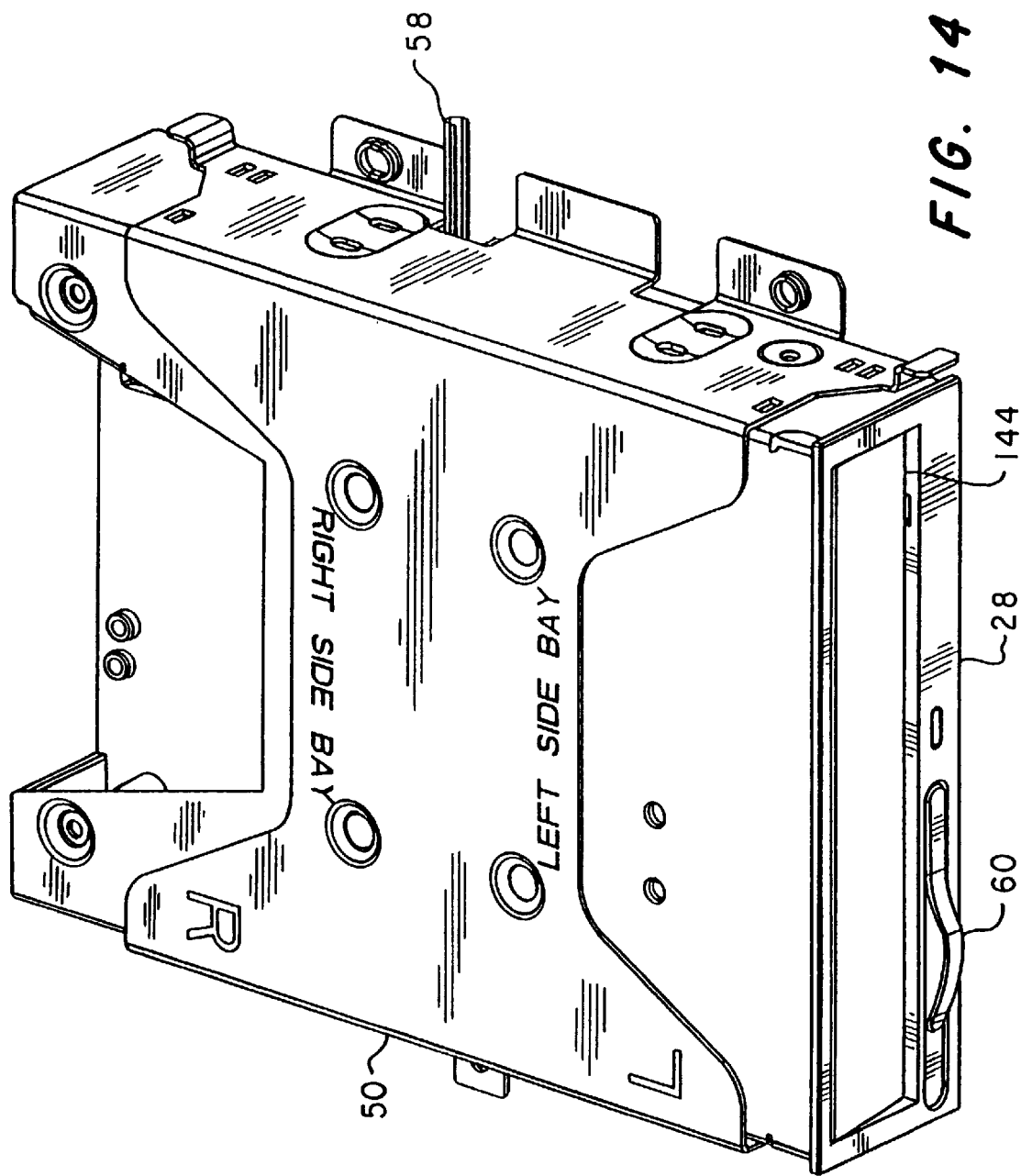
FIG. 14 is a top perspective view of the disk drive module of FIG. 12, showing the disk drive module received in a drive module cage.

In FIG. 14, one of the disk drive modules 28 is shown from a top perspective view thereof. A cage 50 is shown installed thereon and positioned so that the disk drive module 28 and cage 50 are appropriately configured for installation in the leftmost disk drive bay 18 as viewed in FIG. 1. The bar 58, however, is only extended somewhat laterally outward from the disk drive module 28, as would be appropriate if the disk drive module were to be installed in the rightmost disk drive bay 18 as viewed in FIG. 1. If the disk drive module 28 as representatively illustrated in FIG. 14 is installed in the leftmost disk drive bay 18 as viewed in FIG. 1, the disk drive ejection security feature thereof will be inoperative.

Figure 15:
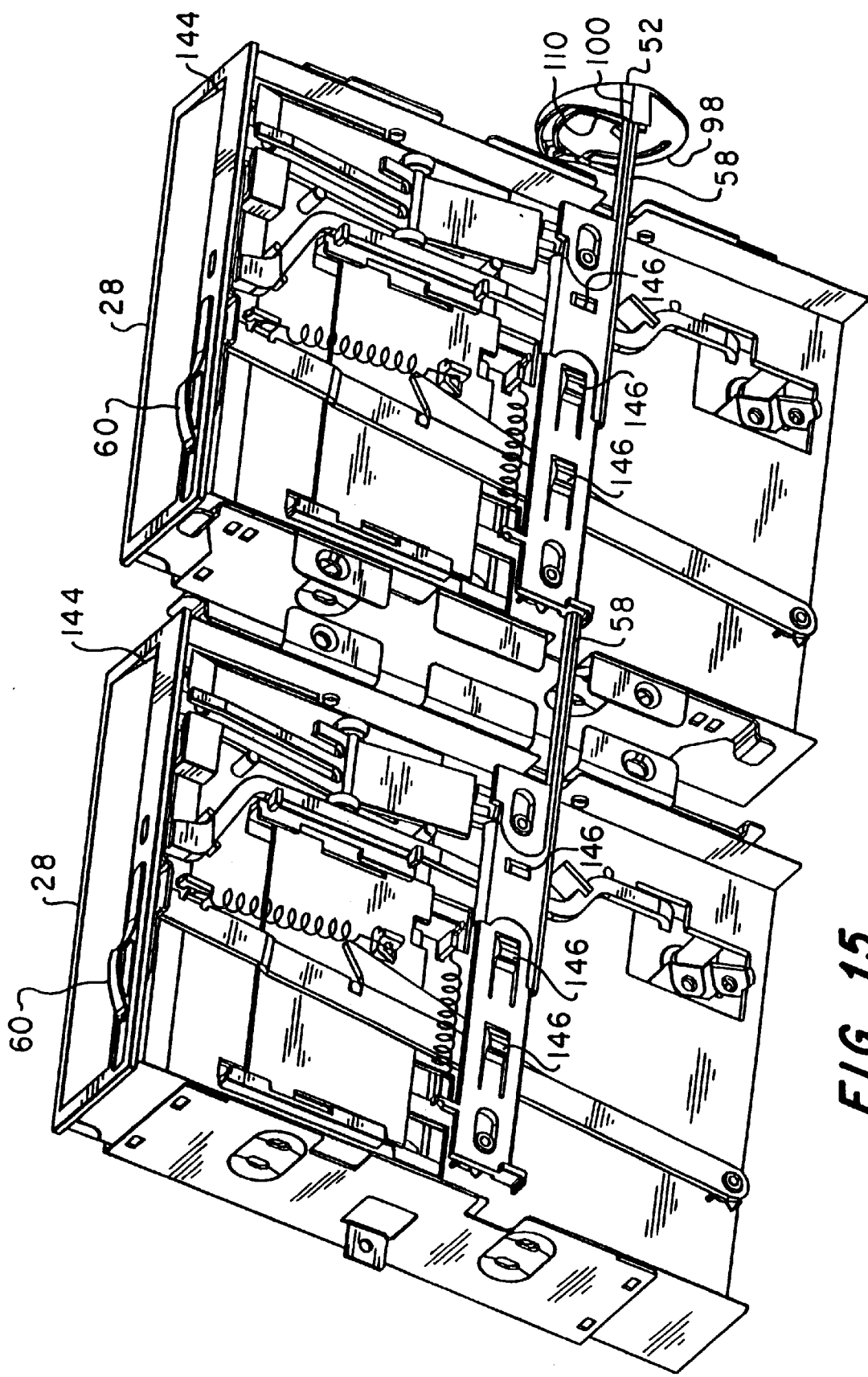
FIG. 15 is a bottom perspective view of multiple ones of the disk drive module of FIG. 12, configured to permit simultaneous operation of a second security feature of the docking station of FIG. 1.

In FIG. 15, the disk drive modules 28 shown in FIGS. 13 & 14 are shown from bottom side perspective views thereof as if installed in the rightmost and leftmost, respectively, disk drive bays 18 as viewed in FIG. 1. The disk drive modules 28 are shown appropriately positioned with respect to one another, and with respect to the cam 52. FIG. 15 shows a modified version of the disk drive ejection security feature in which the lever 108 shown in FIG. 8 is not utilized, the bar 58 of the rightmost disk drive module 28 as viewed in FIG. 15 directly contacting the inner side cam surface 110. In this modified version, the bar 58 on the rightmost disk drive module 28 is positioned to engage the rightmost finger 146. Note that the bar 58 on the leftmost disk drive module 28 as viewed in FIG. 15 is completely extended laterally from the disk drive module by engagement with its rightmost finger 146.

Figure 16:
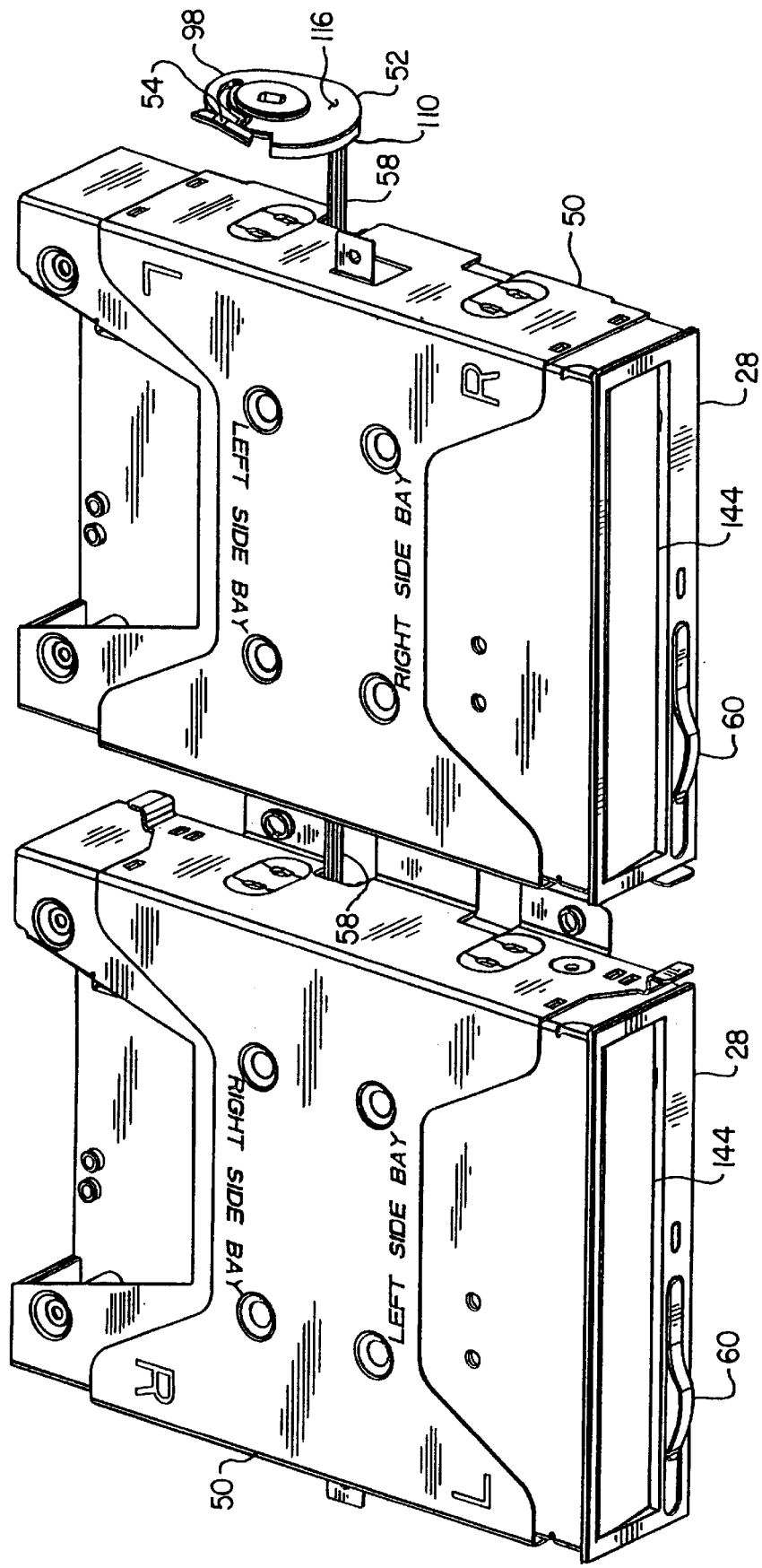
FIG. 16 is a top perspective view of the multiple disk drive modules of FIG. 15.

In FIG. 16 a top side perspective view of the disk drive modules 28 shown in FIG. 15 may be seen. The disk drive ejection security feature for both disk drive modules 28 may be actuated to prevent ejection of the disk drives 144 by rotation of the cam 52 so that the bar 58 on the rightmost disk drive module as viewed in FIG. 16 is laterally inwardly displaced, the bar being displaced by contact with the surface 110 formed on the cam, and the cam being rotated by the keyed lock mechanism 36. Configured as shown in FIG. 16, the disk drive modules 28, cages 50, and cam 52 may be operatively installed in the docking station 10 (without the lever 108 in this modified version). Further detailed description of the disk drive ejection security feature may be found in the copending application referred to hereinabove.

The foregoing detailed description is to be clearly understood as being given by way of illustration and example only, the spirit and scope of the present invention being limited solely by the appended claims.

What is claimed is:

1. A computer docking station of the type capable of operatively receiving a portable computer docked therewith and of operatively receiving a portable disk drive therein, the docking station comprising:
    a disk drive module, said disk drive module being configured for operatively receiving the disk therein and for ejecting the disk drive therefrom;
    a cam disposed externally to the disk drive module, the cam being rotatable relative to the disk drive module; and
    a bar interconnecting said cam and said disk drive module.

2. The docking station according to claim 1, wherein said bar is displaceable by said cam between first and second positions relative to said disk drive module.

3. The docking station according to claim 2, wherein ejection of the disk drive from said disk drive module is prevented when said bar is disposed in said first position, and wherein ejection of the disk drive is permitted when said bar is disposed in said second position.

4. The docking station according to claim 2, wherein said bar is laterally displaceable between said first and second positions by rotation of said cam.

5. The docking station according to claim 2, wherein said cam has an inclined surface formed thereon, said bar contacts said surface when said cam is rotated, and said cam is rotatable to select one of said first and second positions of said bar.

6. The docking station according to claim 1, further comprising a lever pivotably mounted externally relative to said disk drive module such that said lever is pivotable by rotation of said cam.

7. The docking station according to claim 6, wherein said lever is disposed intermediate said cam and said bar such that rotation of said cam causes displacement of said lever and said bar.

8. The docking station according to claim 6, further comprising a bias member contacting said lever, said bias member biasing said lever to contact said cam.

9. The docking station according to claim 1, wherein said cam includes a peripheral and circumferentially extending surface formed thereon, said surface having an inclined portion thereof, and wherein said bar is disposed laterally opposite said surface, said bar being displaceable by said inclined portion when said cam is rotated.

10. The docking station according to claim 1, further comprising a switch mounted proximate said cam, and wherein said switch is operable by displacement of said cam.

11. The docking station according to claim 10, wherein said switch is interconnected between a power supply and said disk drive module, and said switch having a first configuration in which power from said power supply is conductible to said disk drive module and a second configuration in which power from said power supply is interruptable by said switch.

12. The docking station according to claim 11, wherein said switch is configurable in a selected one of said first and second configurations by rotation of said cam.

13. A computer docking station, comprising:
    an enclosure;
    first and second openings formed on said enclosure;
    a disk drive module operatively mounted within said enclosure, said disk drive module being capable of operatively receiving a disk drive therein;
    a power supply capable of supplying power to operate said disk drive module;
    a switch interconnected between said power supply and said disk drive module;
    a closure disposable in an overlying relationship with said first opening;
    a first member disposed on said closure and positionable to prevent displacement of said closure from said overlying relationship with said first opening;
    a second member disposed proximate said second opening and positionable to block access to said second opening;
    a third member disposed on said disk drive module and positionable relative thereto to prevent ejection of the disk drive from said disk drive module;
    a fourth member disposed proximate said second member, said fourth member being engageable with said second member to prevent displacement of said second member in at least one direction relative to said second opening;
    a fifth member disposed proximate said first member, said fifth member being positionable relative to said first member to prevent displacement of said first member from its position preventing displacement of said closure; and
    a cam mounted within said enclosure, said cam being capable of displacing said third, fourth, and fifth members, and said cam further being capable of actuating said switch.

14. The docking station according to claim 13, wherein said cam is capable of simultaneously displacing said third, fourth, and fifth members, and actuating said switch.

15. The docking station according to claim 13, wherein said fifth member is capable of contacting said fourth member to thereby displace said fourth member to engage said second member when said fifth member is displaced by said cam.

* * * * *